United States Patent [19]

Charransol et al.

[11] Patent Number: 4,654,823
[45] Date of Patent: Mar. 31, 1987

[54] READ/WRITE MEMORY AND CELL CONSTITUTING SAME

[75] Inventors: Pierre Charransol, Paris; Jean-Claude Audrix, Colombes; Jacques Gouit, Paris, all of France

[73] Assignee: Thomson-CSF Telephone, Colombes, France

[21] Appl. No.: 720,931

[22] Filed: Apr. 8, 1985

[30] Foreign Application Priority Data

Apr. 6, 1984 [FR] France .................................. 8405480

[51] Int. Cl.[4] .............................................. G11C 11/34
[52] U.S. Cl. ..................................... 365/174; 365/154
[58] Field of Search ............... 365/174, 189, 190, 154, 365/156

[56] References Cited

U.S. PATENT DOCUMENTS 3,644,907  2/1972  Gricchi et al. ...................... 365/190
3,997,881 12/1976  Hoffmann .......................... 365/174
4,134,150  1/1979  Shiga ............................ 365/154 X

FOREIGN PATENT DOCUMENTS 0075919  4/1983  European Pat. Off. ............ 365/154

OTHER PUBLICATIONS

IBM Technical Disclosure Bulletin, vol. 13, No. 7, Dec. 1970, Gaensslen and Terman, "FET Memory Cell", p. 1751.

Primary Examiner—Joseph A. Popek
Attorney, Agent, or Firm—Sughrue, Mion, Zinn, Macpeak & Seas

[57] ABSTRACT

A read/write memory cell comprises a first switch having one input which constitutes the data input-output of the cell and another input connected to a loop circuit comprises a first inverter, a second inverter and a second switch. The first and second switches are controlled in such a way that on a write operation the first is closed and the second open. In the absence of any write or read operation the first switch is open and the second switch is closed. On a read operation both switches are closed. A read/write memory of N words each of P bits is obtained by associating N×P cells of this kind in a matrix comprising N rows and P columns.

4 Claims, 8 Drawing Figures

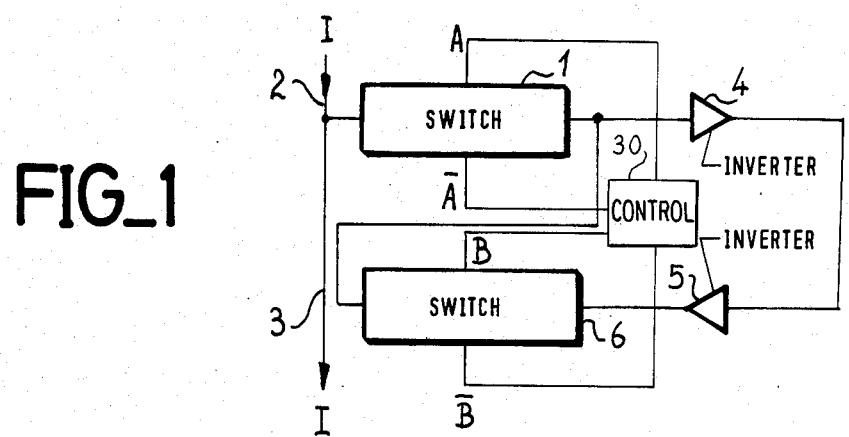
FIG_1
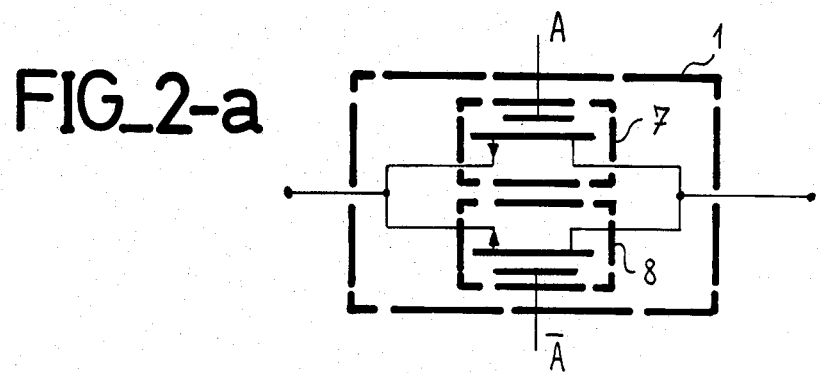
FIG_2-a
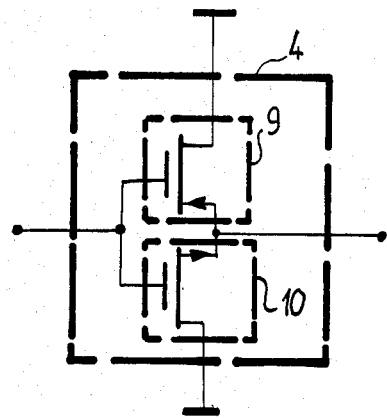
FIG_2-b

FIG_3-a
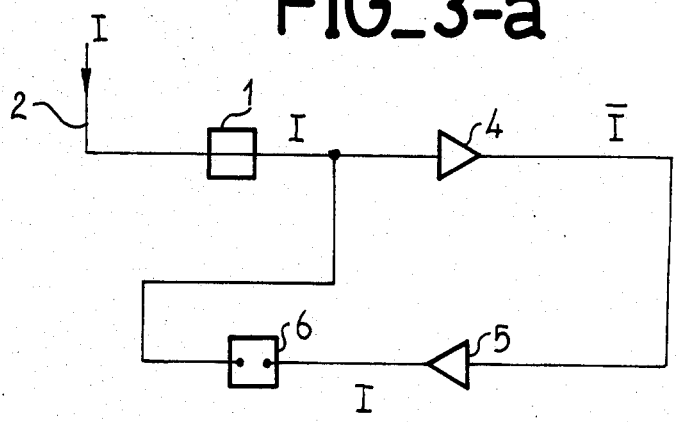
FIG_3-b
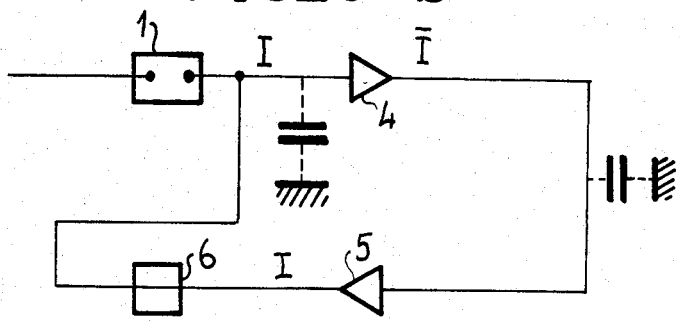
FIG_3-c
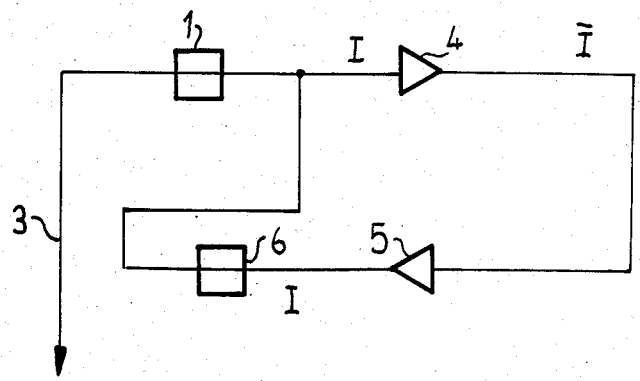

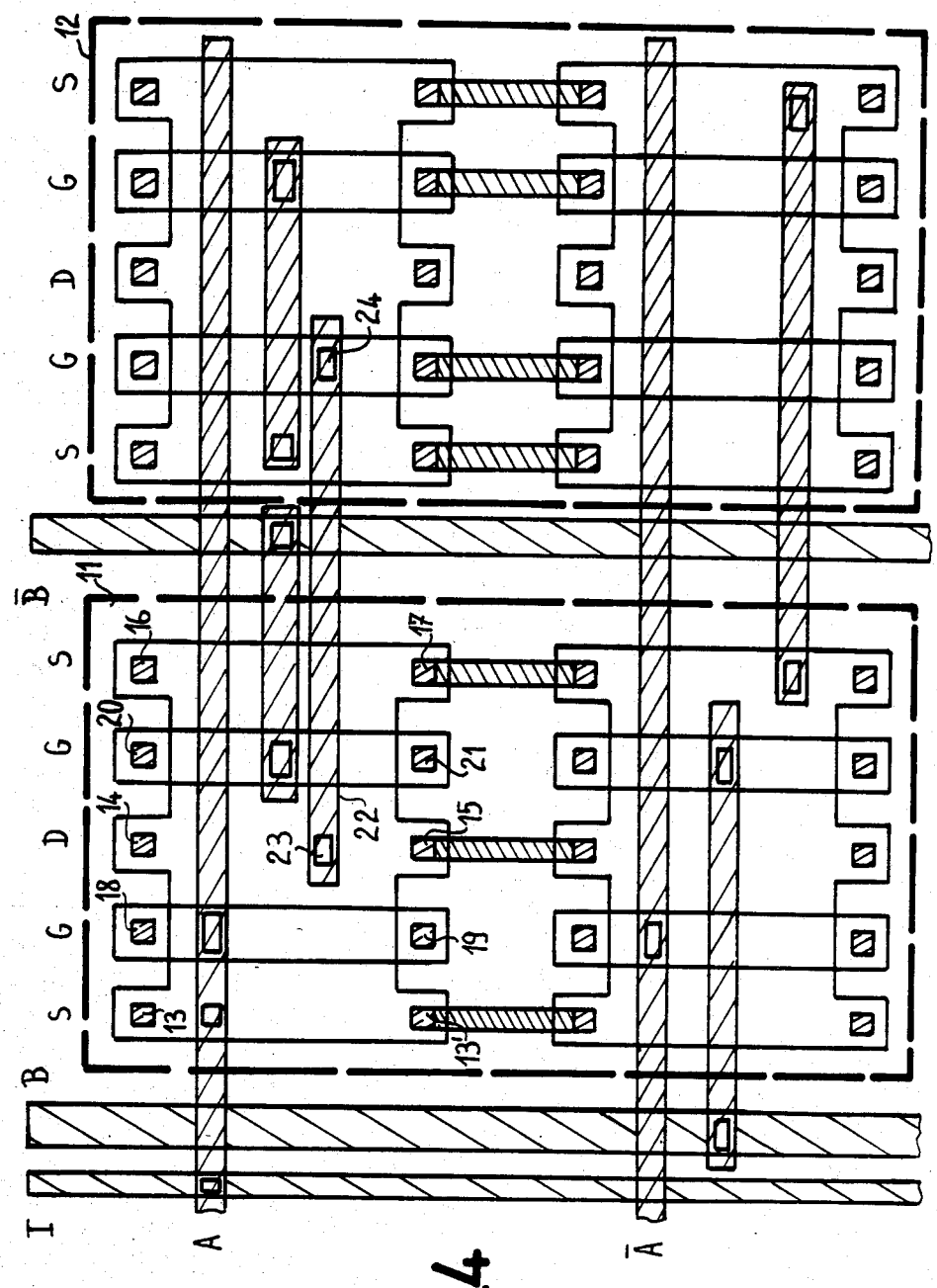
FIG_4

FIG_5
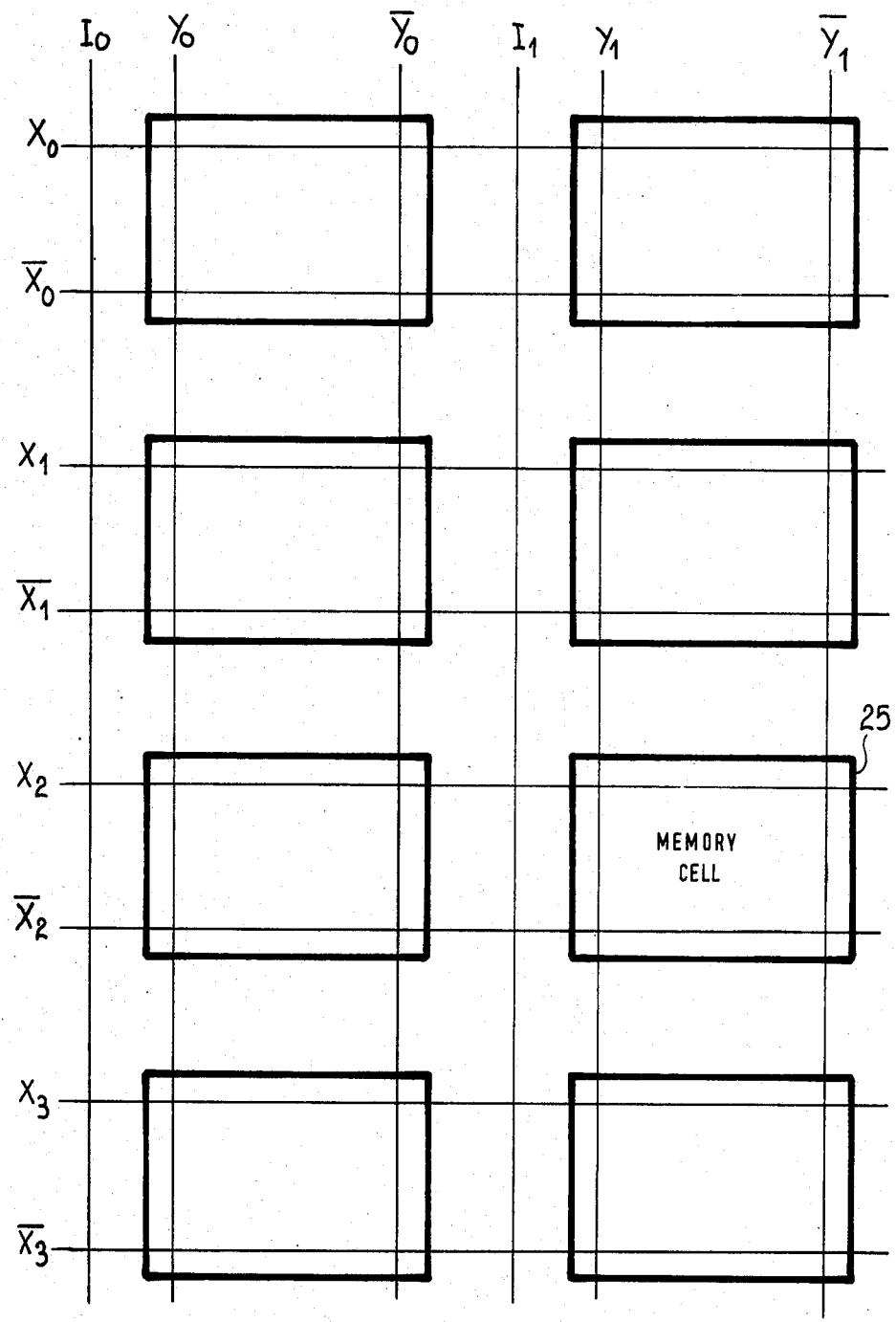

READ/WRITE MEMORY AND CELL CONSTITUTING SAME

BACKGROUND OF THE INVENTION

1. Field of the invention

The present invention concerns a read/write memory cell and a read/write memory obtained by association of such cells, more particularly implemented in integrated circuit form, especially in semi-custom integrated circuit form.

2. Description of the prior art

A semi-custom integrated circuit is a set of transistors, of the MOS type, for example, fabricated in advance on a common semiconductor substrate according to a regular structure which is independent of the function to be subsequently implemented by the integrated circuit, and which are subsequently interconnected to order, as appropriate to the type of function to be implemented by the integrated circuit, a number of areas reserved for interconnections being to this end provided on the surface of the integrated circuit.

The advantage of this technique is to concentrate in the final stage of the fabrication process the implementation of the "customized" part of the integrated circuit, namely the interconnections, and to relegate to preceding stages implementation of the "standard" part of the integrated circuit, common to all users.

On the other hand, it has the disadvantage of making the implementation of the interconnections very complicated beyond a certain degree of complexity of the function to be implemented. As the transistors are disposed in parallel rows, the interconnections consist of a network essentially disposed between these rows (there are in fact a number of interconnections within the rows themselves).

It will be readily appreciated that the number of possibilities is extremely high, given the architecture and the type of function to be implemented, which is hardly consistent with the extreme rigidity of the structure as described.

A well known consequence of this contradiction between the multiplicity of the interconnections of a circuit and the surface area assigned to these interconnections (non-modifiable surface area) is that manufacturers of integrated circuits recommend that a number of transistors (20% in relatively simple situations) remain unused to facilitate the routing of the interconnections. According to the relative complexity of the functions to be implemented, there is thus observed in certain cases a loss of yield of the circuits in terms of surface area used or the converse problem of difficulties in realising the interconnection diagram (when the interconnection network is very dense) and a significant loss of time for its implementation. In certain cases the difficulty may be so great that the integrated circuit manufacturers are obliged to modify the "standard" part of the circuit to provide more space for the areas reserved for interconnections, resulting of course in a loss of yield for all users, that is to say whatever the function to be implemented.

French patent application No 82 05245 filed Mar. 26, 1982 proposes a solution to this problem which consists in providing a continuous succession of rows of transistors over the entire surface area of the substrate and, where necessary, using the surface area occupied by certain of these rows, which are then not connected to the power supply, to make horizontal interconnections (assuming the rows of transistors are horizontal). To obtain a complete interconnection network, vertical interconnections may then be made on an insulative layer covering the horizontal interconnections.

This latter technique corresponds to the so-called free interconnection semi-custom integrated circuit technique.

The present invention is more particularly concerned with the implementation of read/write memories (also known as random access memories) in integrated circuit form. These are not for main memory purposes (for which commercially available high-capacity devices are without doubt a better solution), but rather decentralized memories for specific peripheral processing tasks. In this case the use of standard commercially available memories results in a very low yield since the range available is not infinite and their n×p format (n words each of p bits) is not adaptable to specific cases without an expensive loss of words or bits not used.

An object of the present invention is a read/write memory cell and an arrangement of such cells forming a read/write memory with an n×p format (n words each of p bits) especially suited to implementation in free interconnection semi-custom MOS integrated circuit form.

The invention provides for limiting the interconnection network of a free interconnection semi-custom integrated circuit read/write memory to the vertical interconnections, and thus for considering as active, and electrically live, the entire surface area of the integrated circuit. Furthermore, the implementation of a read/write memory cell in accordance with the invention requires only eight transistors (four of type P and four of type N) which, given the organisation of the transistors in a free interconnection semi-custom type integrated circuit, ensures compact dimensions in association with high capacity.

Also, the fact that each cell in accordance with the invention requires only two control signals, whether for writing or reading or in the absence of any write or read operation, authorizes matrix-type addressing and, given a matrix arrangement of a set of such cells to form a memory with an n×p format (n words each of p bits), offers the possibility of expanding the memory by simple repetition, without major modification of the structure and thus of the fabrication process.

SUMMARY OF THE INVENTION

In one aspect, the invention consists in a read/write memory cell comprising a first switch, a loop circuit comprising a first inverter, a second inverter and a second switch, said first switch having one input which constitutes the data input-output of the cell and another input connected to said loop circuit, and control means whereby on a write operation said first switch is closed and said second switch is open, on a read operation said first and second switches are closed and when no write or read operation is in progress said first switch is open and said second switch is closed.

In another aspect, the invention consists in a memory with N words each of P bits comprising N×P read/write memory cells each comprising a first switch, a loop circuit comprising a first inverter, a second inverter and a second switch, said first switch having one input which constitutes the data input-output of the cell and another input connected to said loop circuit, and control means whereby on a write operation said first switch is closed and said second switch is open, on a read operation said first and second switches are closed and when no write or read operation is in progress said first switch is open and said second switch is closed, wherein each of said switches comprises a P-type MOS transistor and an N-type MOS transistor in parallel having their transfer electrodes connected in pairs and their respective control electrodes connected to receive two complementary signals A and $\overline{A}$ in the case of said first switch and two complementary signals B and $\overline{B}$ in the case of said second switch, in which memory said cells are arranged in a matrix comprising N rows and P columns and the MOS transistors constituting said first switch of the cells in the same row n are controlled by the same signals $X_n$ and $\overline{X}_n$ and the MOS transistors constituting said second switch of the cells in the same column p are controlled by the same signals $Y_p$ and $\overline{Y}_p$.

Other objects and advantages will appear from the following description of an example of the invention, when considered in connection with the accompanying drawings, and the novel features will be particularly pointed out in the appended claims.

BRIEF DESCRIPTION OF THE DRAWINGS

FIG. 1 is a logic diagram of a read/write memory cell in accordance with the invention.

FIGS. 2a and 2b respectively show the implementation using MOS transistors of a switch and an inverter forming the memory cell shown in FIG. 1.

FIGS. 3a, 3b, 3c are schematics respectively showing the operation of the cell shown in FIG. 1 during a write operation, in the absence of any write or read operation and during a read operation.

FIG. 4 is a layout schematic of an integrated circuit implementing a read/write memory cell in accordance with the invention.

FIG. 5 is a schematic showing the implementation of a read/write memory with an n×p format (four words each of two bits, for example) from cells in accordance with the invention.

DESCRIPTION OF THE PREFERRED EMBODIMENT

The read/write memory cell shown in FIG. 1 comprises a first switch 1 which is connected to a write wire 2 carrying information I to be written into this cell and to a read wire 3 carrying information I read from the cell, and to a loop circuit comprising, in the following order, a first inverter 4, a second inverter 5 and a second switch 6.

There is shown in FIG. 2a the implementation of a switch, the switch 1, for example, using MOS transistors.

This switch is formed by the parallel association of two transistors, one (7) of type N and the other (8) of type P, the drain and source (or transfer electrodes) of each of which are connected to its respective counterpart and the grid (or control electrode) of each of which receives either a control signal A or its complement $\overline{A}$ according to the transistor type (N or P). The switch 6 is similarly implemented, the control signals then being designated B and $\overline{B}$. The signals A, $\overline{A}$, B and $\overline{B}$ are supplied from a control circuit 30.

The fact that two complementary control signals are applied to the respective grids of two MOS transistors of complementary types associated in this way means that both transistors are simultaneously in the same state, either conducting or cut off. If both are conducting, the logic level applied to any of the transfer electrodes is transferred to the other, and vice versa; if both are cut off, the logic level applied to any of the transfer electrodes is not transferred to the other. Thus it is indeed a switch.

FIG. 2b shows the implementation of an inverter, the inverter 4, for example, using MOS transistors (the inverter 5 being implemented in the same way). The inverter is formed by the series association of two transistors, one (9) of type N and the other (10) of type P, interconnected by one of their transfer electrodes, the other transfer electrode being held at a specific potential. A common input signal is applied to the control electrodes of the two transistors and the corresponding output signal is obtained on the transfer electrode common to the two transistors.

The fact that the same control signal is applied simultaneously to the grids of two transistors of complementary types and associated in this way means that they are simultaneously in opposite states, one conducting and the other cut off, and in each case the specific circuit of that of the two which is conducting means that it behaves as an inverter.

Refer now to FIG. 3 showing the operation of the cell shown in FIG. 1.

During a write operation the control signals A, $\overline{A}$, B, $\overline{B}$ of the switches 1 and 6 are such that the switch 1 is closed and the switch 6 is open. The circuit of the cell is then equivalent to that shown in FIG. 3a, in which the switch 1 is symbolically represented by a continuous line and the switch 6 by an interrupted line. The information I to be written, present on wire 2, is then inverted ($\overline{I}$) at the output of the inverter 4 and then inverted again (I) at the output of the inverter 5.

In the absence of any write or read operation the control signals A, $\overline{A}$, B, $\overline{B}$ of the switches 1 and 6 are such that the switch 1 is open and the switch 6 is closed. The circuit of the cell is then equivalent to that shown in FIG. 3b. The transient changeover from the situation of FIG. 3a (in which information to write I is available at the output of the switch 1) to the situation of FIG. 3b (in which the information I is no longer available at the output of the switch 1) does not destroy the information 1 because of the preponderant influence of the stray capacitances shown on the diagram. The loop formed by the inverters 4 and 5 ensures that the information I is statically and continuously maintained in the memory cell.

During a read operation the control signals A, $\overline{A}$, B, $\overline{B}$ of the switches 1 and 6 are such that both switches are simultaneously closed. The circuit of the cell is then equivalent to that of FIG. 3c. The stored information I may then be read out over the read wire 3.

FIG. 4 shows the read/write memory cell in accordance with the invention implemented in semi-custom integrated circuit form.

A semi-custom integrated circuit comprises a set of transistors disposed in parallel rows, alternately of type N and type P. A basic cell, such as cell 11 or 12, of a semi-custom integrated circuit comprises four MOS transistors, two type N transistors and two type P transistors occupying two adjacent rows.

To facilitate the interconnections, the electrodes of these transistors are accessible at points grouped in pairs. Thus for the base cell 11, one of the transfer electrodes (drain or source) of the lefthand transistor of the top row is accessible at points 13 and 13'. The other transfer electrode of this transistor, common with one of the transfer electrodes of the righthand transistor, is accessible at points 14 and 15, the other transfer electrode of the latter transistor being accessible at points 16 and 17. Each of these transistors comprises a grid, or control electrode, accessible at points 18 and 19 in the case of the lefthand transistor and points 20 and 21 in the case of the righthand transistor.

The implementation of a read/write memory cell in accordance with the invention requires four type P transistors and four type N transistors (two per switch, two per inverter), that is to say in all two basic cells such as cells 11 and 12, and all transistors of the cells are used, guaranteeing maximum compactness and economy of surface area.

There are also shown in FIG. 4 the interconnections between the various electrodes of these transistors, enabling the logic diagram of FIG. 1 to be obtained, cross-referencing from one figure to the other being facilitated by FIGS. 2a and 2b showing the intermediate stage of implementation of a switch and an inverter using MOS transistors.

In the diagram of FIG. 4, these interconnections are symbolically represented by shaded horizontal or vertical bands. The horizontal band 22 provides a connection between the grid of the transistor situated top right of the basic cell 11, to which it gains access through a connection hole 23 (symbolically represented by a rectangle), and the grid of the transistor situated top left in the basic cell 12, to which it gains access by a connecting hole 24 (also symbolically represented by a rectangle). The wires carrying signals A, $\overline{A}$, B, $\overline{B}$ and I are shown by shaded horizontal and vertical bands, like the interconnections.

FIG. 5 shows an arrangement of eight read/write memory cells 25 as shown in FIG. 4, disposed in a matrix comprising four rows (numbered 0 through 3) and two columns (numbered 0 and 1) to form a read/write memory comprising four words each of two bits.

The cells on a common line are controlled by the same signals X and $\overline{X}$ ($X_2$ and $\overline{X}_2$ in the case of row 2, for example). The cells disposed on the same column are controlled by the same signals Y and $\overline{Y}$ ($Y_1$ and $\overline{Y}_1$ in the case of column 1, for example). The set of signals X, $\overline{X}$, Y, $\overline{Y}$ corresponds to the signals A, $\overline{A}$, B, $\overline{B}$ previously used for a single cell.

This matrix control scheme provides individual and separate control of each cell. Thus cell 25 situated at the intersection of the second row and the first column is uniquely controlled by the signal set ($X_2$, $\overline{X}_2$, $Y_2$, $\overline{Y}_2$).

In addition to its control input, each cell has an input-output for the information I to write and read. As addressing is exclusively at word level, a total number of inputs-outputs equal to the number of bits per word is sufficient. Thus in the specific case of FIG. 5, two inputs-outputs $I_0$ and $I_1$ are provided, corresponding to the two bits of a word.

This matrix arrangement offers the advantage of making the structure of these memories independent of their $n \times p$ format (n words each of p bits). Increasing either or both of the values n and p, with reference to FIG. 5, for example, amounts to simple expansion of this structure in the X or Y direction, or both directions at once, without modifying the basic structure.

This arrangement has a further advantage which, as shown by FIG. 5, is that it limits the interconnection network of a semi-custom integrated circuit to the vertical connections. This is of particular importance in the case of free interconnection semi-custom integrated circuits, as the saving in terms of surface area is then optimal.

It will be understood that various changes in the details, materials and arrangements of parts which have been herein described and illustrated in order to explain the nature of the invention may be made by those skilled in the art within the principle and scope of the invention as expressed in the appended claims.

There is claimed:

1. Read/write memory cell comprising a first switch, a loop circuit comprising a first inverter, a second inverter and a second switch, said first switch having a first transfer terminal connected to a data input-output of the cell and a second transfer terminal connected to an input of said first inverter, said first inverter having an output connected to and input of said second inverter, said second inverter having an output connected to a first transfer terminal of said second switch, said second switch having a second transfer terminal connected to said second transfer terminal of said first switch, and means for controlling said first and second switches whereby on a write operation said first switch is closed and said second switch is open, on a read operation said first and second switches are closed, and when no write or read operation is in progress, said first switch is open and said second switch is closed.

2. Cell according to claim 1, implemented as an MOS integrated circuit.

3. Cell according to claim 2, wherein each of said switches comprises a P-type MOS transistor and an N-type MOS transistor in parallel having their transfer electrodes connected in pairs and their respective control electrodes connected to receive from said control means two complementary signals A and $\overline{A}$ in the case of said first switch and two complementary signals B and $\overline{B}$ in the case of said second switch.

4. Memory with N words each of P bits comprising $N \times P$ read/write memory cells each comprising a first switch, a loop circuit comprising a first inverter, a second inverter and a second switch, said first switch having a first transfer terminal connected to a data input-output of the cell and a second transfer terminal connected to an input of said first inverter, said first inverter having an output connected to and input of said second inverter, said second inverter having an output connected to a first transfer terminal of said second switch, said second switch having a second transfer terminal connected to said second transfer terminal of said first switch, and means for controlling said first and second switches whereby on a write operation said first switch is closed and said second switch is open, on a read operation said first and second switches are closed, and when no write or read operation is in progress, said first switch is open and said second switch is closed, wherein each of said switches comprises a P-type MOS transistor and an N-type MOS transistor in parallel having their transfer electrodes connected in pairs and their respective control electrodes connected to receive two complementary signals A and $\overline{A}$ in the case of said first switch and two complementary signals B and $\overline{B}$ in the case of said second switch, in which memory said cells are arranged in a matrix comprising N rows and P columns, the MOS transistors constituting said first switch of the cells in the same row n are controlled by the same signals $X_n$ and $\overline{X}_n$ and the MOS transistors constituting said second switch of the cells in the same column p are controlled by the same signals $Y_p$ and $\overline{Y}_p$.

* * * * *